United States Patent
Guenther et al.

(10) Patent No.: US 7,148,624 B2
(45) Date of Patent: Dec. 12, 2006

(54) UNIFORM DEPOSITION OF ORGANIC LAYER

(75) Inventors: Ewald Guenther, Regenstauf (DE); Hooi Bin Lim, Penang (MY); Cheng Kooi Tan, Penang (MY); Shi Chai Chong, Penang (MY); Hagen Klausmann, Muenstertal (DE)

(73) Assignee: Osram Opto Semiconductors (Malaysia) Sdn. Bhd, Penang (MY)

( * ) Notice: Subject to any disclaimer, the term of this patent is extended or adjusted under 35 U.S.C. 154(b) by 0 days.

(21) Appl. No.: 10/249,533

(22) Filed: Apr. 17, 2003

(65) Prior Publication Data

US 2003/0214232 A1 Nov. 20, 2003

Related U.S. Application Data

(63) Continuation-in-part of application No. 10/142,208, filed on May 7, 2002.

(51) Int. Cl.
*H05B 33/06* (2006.01)
*H05B 33/04* (2006.01)
*H01L 51/50* (2006.01)

(52) U.S. Cl. .................. 313/512; 313/506; 313/49
(58) Field of Classification Search ............... 313/498, 313/506, 507, 512, 49
See application file for complete search history.

(56) References Cited

U.S. PATENT DOCUMENTS

| | | | |
|---|---|---|---|
| 4,954,746 A * | 9/1990 | Taniguchi et al. .......... 313/506 |
| 5,059,148 A | 10/1991 | McKenna et al. |
| 5,427,858 A * | 6/1995 | Nakamura et al. .......... 428/421 |
| 5,962,962 A | 10/1999 | Fujita et al. |
| 5,965,981 A | 10/1999 | Inoguchi et al. |
| 6,195,142 B1 | 2/2001 | Gyotoku et al. |
| 6,307,317 B1 * | 10/2001 | Codama et al. .......... 313/504 |
| 6,498,428 B1 | 12/2002 | Matsuura et al. |
| 6,522,067 B1 * | 2/2003 | Graff et al. .......... 313/512 |
| 6,590,337 B1 * | 7/2003 | Nishikawa et al. .......... 313/509 |
| 6,605,826 B1 | 8/2003 | Yamazaki et al. |
| 6,624,570 B1 | 9/2003 | Nishio et al. |
| 6,624,572 B1 | 9/2003 | Kim et al. |
| 6,633,121 B1 * | 10/2003 | Eida et al. .......... 313/512 |
| 6,844,673 B1 * | 1/2005 | Bernkopf .......... 313/506 |
| 6,888,308 B1 | 5/2005 | Guenther |
| 2001/0017516 A1 | 8/2001 | Gonther |
| 2003/0062830 A1 | 4/2003 | Guenther et al. |
| 2003/0094691 A1 | 5/2003 | Auch et al. |

FOREIGN PATENT DOCUMENTS

| | | |
|---|---|---|
| JP | 2001-102166 | 4/2001 |
| JP | WO 01-45140 A2 | 6/2001 |
| WO | WO98/53644 | 11/1998 |
| WO | WO 01-44865 A1 | 6/2001 |
| WO | WO 02-21883 A1 | 3/2002 |

* cited by examiner

*Primary Examiner*—Mariceli Santiago
(74) *Attorney, Agent, or Firm*—Fish & Richardson P.C.

(57) ABSTRACT

A method to ensure uniform deposition of organic layer is disclosed. Since the organic layer is very thin, any deviation from the target thickness will result in visible optical defects. A homogenous layer which exhibits good coating behaviour with organic materials is provided beneath the organic layer. By covering the metal interconnects, the adverse effect on the uniformity of the polymer layer is reduced or prevented.

47 Claims, 8 Drawing Sheets

US 7,148,624 B2

UNIFORM DEPOSITION OF ORGANIC LAYER

CROSS REFERENCE TO RELATED APPLICATIONS

This application is a continuation-in-part of patent application entitled "Improved Encapsulation for Electroluminescent Devices", U.S. Ser. No. 10/142,208 filed May 7, 2002 which is herein incorporated by reference for all purposes.

BACKGROUND OF INVENTION

FIG. 1 shows a conventional electroluminescent device 100 having one or more OLED cells. An OLED cell includes a functional stack of one or more organic functional layers 110 between a transparent conductive layer 105 (e.g., indium tin oxide or ITO) and a conductive layer 115. The conductive layers serve as electrodes. The cells are fabricated in an active region 185 on a substrate 101. The cells can be configured as desired to form a display or lamp. A metallization layer which forms interconnections to the electrodes and bond pads 150 is provided. The bond pads are coupled to, for example, driving circuitry to control the operation of the OLED cells. A cap 160 encapsulates the device, hermetically sealing the OLED cells to protect them from the environment (e.g., moisture and/or air.)

The organic functional layer comprises, for example, a conjugated polymer which is dissolved in a solution. The polymer is deposited on the substrate by, for example, spin-coating or doctor blading techniques or other deposition/printing techniques. Generally, the organic layer is relatively thin, for example, about 50–400 nm. Since the organic layer is very thin, small deviations or non-uniformity in the layer can result in optical defects in device operation.

The organic layer coats the glass substrate which is prepared with patterned structures, such as metal interconnection and ITO electrode structures. The various structures create an uneven topography on the substrate surface. The various materials beneath have different surface energies, which, along with the substrate topography, make it difficult to provide a uniform organic layer.

To improve coating uniformity in the organic layer, various solutions have been proposed. Such solutions include, for example, treating the surface of the substrate by oxygen or plasma, selecting suitable metals to which the organic material exhibits good coating behavior, or modifying the organic material to produce good coating properties. However, such solutions have been ineffective because the good coating properties of the organic material is achieved by sacrificing manufacturability which results in higher manufacturing cost and/or performance degradation.

As evidenced from the above discussion, it is desirable to provide a uniform organic functional layer in organic devices, without adversely impacting device performance or increasing cost of manufacturing.

SUMMARY OF INVENTION

The invention relates to the uniform deposition of organic layers in organic devices. The organic device includes a substrate whereby, at least one organic layer is deposited on the substrate, on top of other layers such as electrodes or metal interconnects. A homogenous layer, such as photoresist, which exhibits good coating property with active organic materials, is provided beneath the organic layer. This avoids the detrimental effect of the underlying metal, which could affect the uniform deposition of organic layer on the substrate, causing defects in, for example, OLED cells.

DETAILED DESCRIPTION

Figure 1:
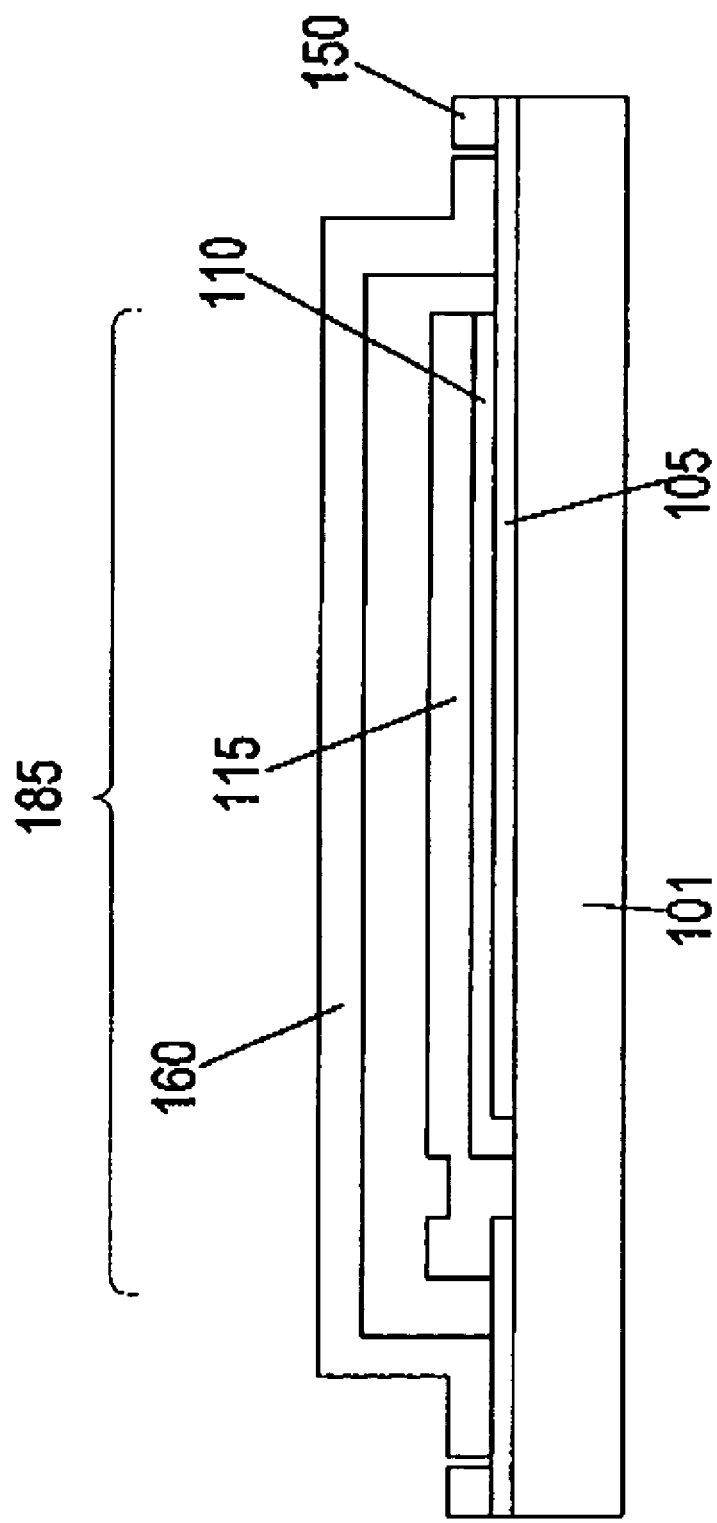
FIG. 1 shows a conventional OLED device.
Figure 2:
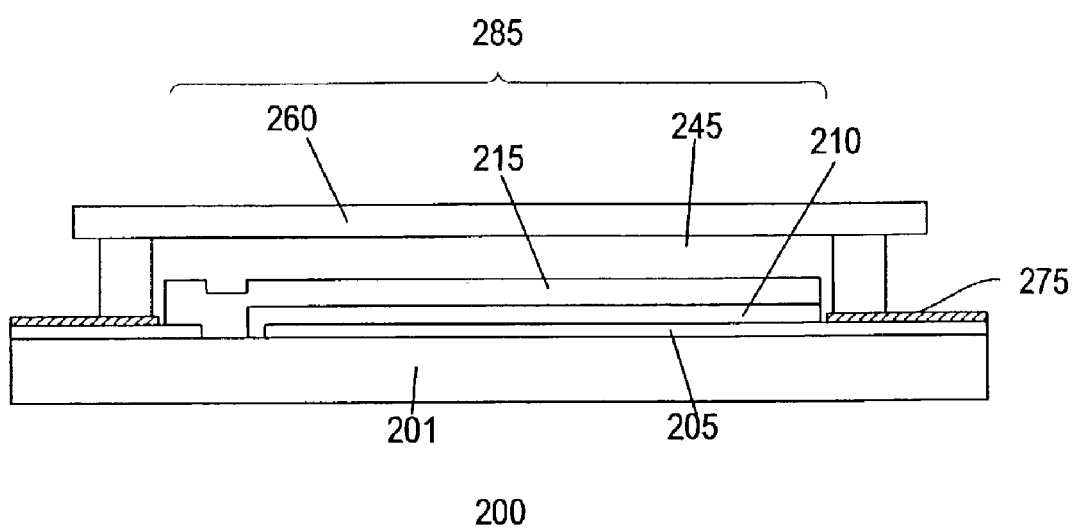
FIG. 2 shows an embodiment of the invention.

FIG. 2 shows an organic device 200 in accordance with one embodiment of the invention. The device comprises a substrate 201 having an active region 285 in which one or more active components are formed. The active components, in one embodiment, comprise an organic material. In one embodiment, the active component comprises one or more OLED cells, forming an OLED device. Providing other types of active components having organic material can also be useful to form other types of devices.

In one embodiment, the substrate comprises a transparent substrate, such as glass. Other types of transparent materials that can serve as a substrate to support the OLED cells are also useful. For example, plastic films can be used to serve as a substrate. Plastic materials are particularly useful to form flexible devices. The use of non-transparent materials for example Si is also useful, particularly for applications which view through the cap.

An OLED cell comprises one or more organic layers (organic stack) 210 sandwiched between first and second electrodes 205 and 215. Preferably, the organic layers comprise conjugated polymers. Other types of organic materials, such as low molecular materials, oligomers, starburst compounds or dendrimer materials, are also useful. Such materials include tris-(8-hydroxyquinolate)-aluminum (Alq), poly(p-phenylene vinylene) (PPV) or polyfluorene (PF). Other types of functional organic layers, including fluorescence or phosphorescence-based layers, are also useful. In one embodiment, a hole transport layer (HTL) is included in the organic stack 210. The HTL, for example, comprises a polymer blend, which typically contains polyaniline (Pani) or polythylenedioxythiophene (Pedot). The thickness of the organic stack is typically about 2500 nm.

The first electrode 205 serves as, for example, the anode while the second electrode serves as the cathode. At least one of the electrodes comprises a transparent conductive material, such as indium tin oxide (ITO). The cathodes and anodes can be patterned as desired to form one or more OLED cells. For example, the cathodes and anodes are formed as strips in respective first and second directions, creating a pixelated device. Other patterns are also useful. Typically, the first and second directions are orthogonal to each other.

A cap 260 is bonded to the substrate in the cap bonding region surrounding the active region, encapsulating the OLED cells. The cap creates a cavity 245 to protect the cells from being damaged by physical contact with the cap.

The active area of the device can, for example, include shaped pillars (not shown) for patterning the device layers. The shaped pillars, which comprise an undercut, are used to pattern the top electrodes. The use of shaped pillars is described in, for example, "Production of Structured Electrodes" (US 2001/0017516A1) and "Patterning of Electrodes in OLED Devices" (PCT/SG00/00134), which are herein incorporated by reference for all purposes.

The substrate includes conductive interconnects 205 located outside the active region 285. The interconnects comprise, for example, a metal. As previously described, the metal interconnects can adversely affect the uniformity of the organic layer. The unevenness of the organic layer may permeate from the areas outside the non-active region where the organic layer is in contact with the underlying metal layer into the active region, thus adversely affecting the active components.

In accordance with one embodiment of the invention, a homogenous layer 275 is provided on the substrate outside the active area. The homogenous layer covers the metal interconnects in the non-active region of the substrate. The homogenous layer comprises a material which promotes uniformity in the organic layer used to form the active components. By covering the metal interconnects, the adverse effect on the uniformity of the organic layer is reduced or prevented. Preferably, the material comprises an insulating material to prevent shorting of the interconnects. For application where the material of the homogeneous layer is conducting, an insulating layer should be provided beneath the protective layer. More preferably, the homogenous layer is formed from a material which is compatible with the fabrication process of the device. For example, the material should be easily deposited on the substrate or easily removed selectively to expose portion of the underlying interconnects as desired. Preferably, the material can be deposited or easily be removed using processes which are already used in the fabrication of the devices, thus avoiding the need for additional tools or chemistry.

In one embodiment, the homogenous layer comprises a photosensitve material, such as photoresist. Other types of photosensitive materials, for example polyimide, are also useful. Non-photosensitive materials such as resins or non-photosensitive polyimide, can also be used. Other types of materials having good coating behavior with organic materials can also be used. These include for example Novolak resin, polybenzoxazole, perylene.

The homogenous layer can also advantageously serve as a surface protection layer. For example, portions of the organic layer outside the active area may need to be removed, such as in the cap bonding region to promote adhesion between the cap and substrate or to expose the underlying metal interconnects for bond pads. Removal of the organic layer is typically achieved using laser ablation. However, the laser ablation process may damage the metal interconnects, rendering the device defective or adversely affecting its performance. By providing the homogenous layer beneath the organic layer, the metal interconnects can be protected from damage during the laser ablation process. The thickness of the homogenous layer should be sufficient to reduce or negate the adverse impact of the metal interconnects on the uniformity of the organic layer. Additionally, the homogenous layer should be sufficiently thick to protect the underlying layers from damage during process for selectively removing the polymer material. Typically, the thickness is about 0.52 μm. Other thicknesses may also be useful.

Figure 3:
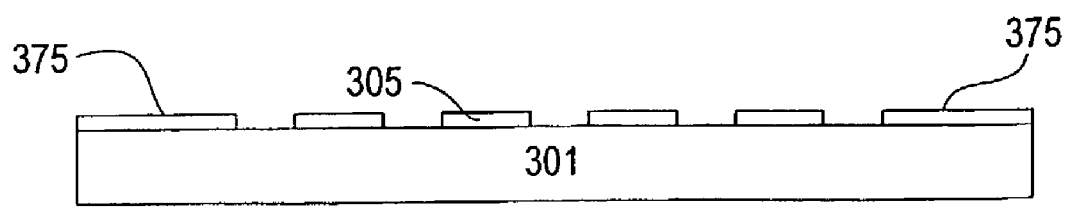
FIGS. 3–8 show a process for fabricating an OLED device in accordance with one embodiment of the invention.

FIGS. 3–7 show a process for fabricating an OLED device in accordance with one embodiment of the invention. Referring to FIG. 3, a substrate 301 is provided. In one embodiment, the substrate comprises a transparent substrate, for example, soda lime or borosilicate glass. Other types of transparent materials can also be used to serve as the substrate. The substrate typically is about 0.4–1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly (enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. Alternatively, materials such as ultra thin glass (e.g., thickness between 10–100 um), a composite stack comprising glass and polymer or polymer films coated with inorganic barrier layers can also be used.

The substrate is prepared with first electrodes 305. The first electrodes are located on at least the active region. The first electrodes serve as, for example, anodes. The anodes can be formed by, for example, depositing and patterning a conductive layer on the substrate. Various techniques, such as photolithography, can be used to pattern the conductive layer. In one embodiment, the anodes are arranged in strips in a first direction. Anodes having other patterns are also useful. In one embodiment, the conductive material comprises a transparent conductive material such as indium-tin-oxide (ITO). Other transparent conductive materials, for example, indium-zinc-oxide, zinc-oxide, tin-oxide, are also useful.

Interconnects 375 are provided on the substrate outside the active region. The interconnects are coupled to, for example, the electrodes. In one embodiment, a conductive layer is deposited over the substrate and patterned to form electrical interconnections 375 and bond pads. The conductive layer comprises, for example, a metal such as Al, Ag, Au or Cr. Patterning of the conductive layer can be achieved using conventional mask and etch techniques.

Figure 4:
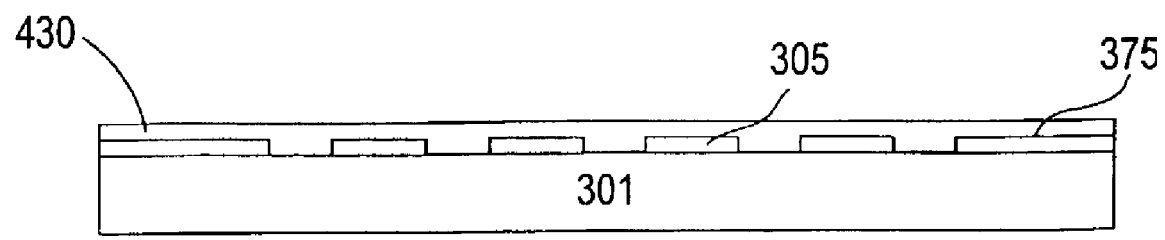

Referring to FIG. 4, a device layer 430 is deposited over the substrate. The device layer, in one embodiment, comprises photoresist. Various types of photoresist, for example, positive or negative acting, can be used. Other types of photosensitive materials or non-photosensitive materials which promote uniformity in the active polymer layer can also be used. If the device layer comprises a conductive material, an insulating layer is provided beneath it, if necessary, to prevent shorting of interconnects.

Figure 5:
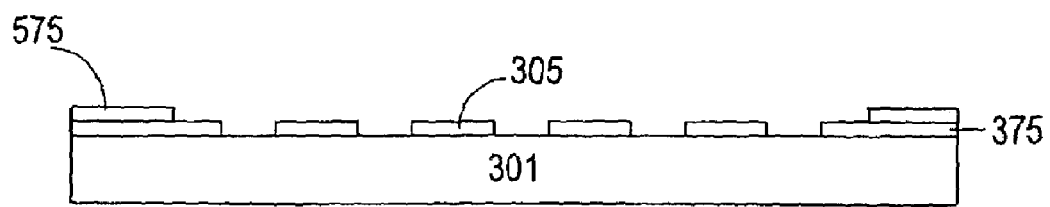

Referring to FIG. 5, the device layer is then patterned to form a homogenous layer 575 in the area outside the active region. If a photosensitive device layer is used, it is patterned by selectively exposing portions and removing the exposed or unexposed portions, depending on whether a positive or negative photosensitive material is used. On the other hand, conventional mask and etch techniques can be used to pattern a non-photosensitive device layer.

Figure 6:
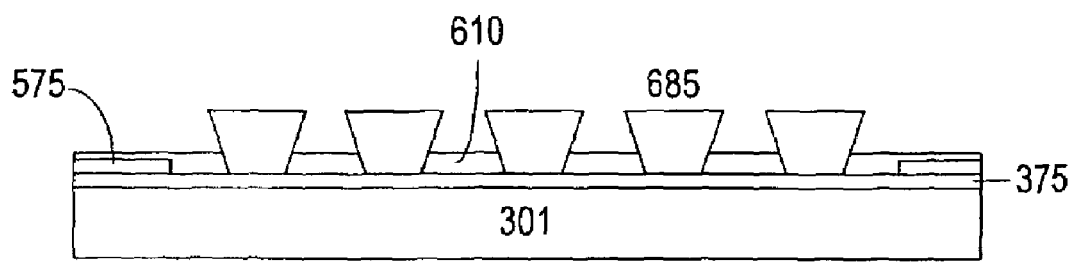

Referring to FIG. 6, the process continues to complete the fabrication of the OLED device. Various conventional techniques can be used to complete the OLED device. In one embodiment, shaped pillars 685 are formed on the substrate. The shaped pillars comprises an undercut, for example a v-shape profile, to sufficiently interrupt the conductive layer during deposition to form the electrodes. Preferably, the shaped pillars are formed from a single layer of material. In one embodiment, the shaped pillars are formed from a single layer comprising a negative photoresist. Other types of photosensitive materials can also be used. Non-photosensitive materials can also be used to form shaped pillars. Alternatively, the shaped pillars are formed from multiple layers to create a t-shaped profile. The multiple layers can be formed from photosensitive and/or non-photosensitive materials.

After the pillars are formed, a functional organic layer 610 is deposited on the substrate. In one embodiment, the functional organic layer comprises a conjugated polymer. Other types of organic materials are also useful. The polymer is deposited by, for example, spin-coating. Other deposition techniques can also be used. Additional functional layers can be deposited to form a functional organic stack. Different types of polymers can be deposited to form a multi-color OLED device. The presence of a homogenous layer over the metal layer outside the active region ensures a good uniform deposition of polymer layer. It therefore eliminates any unevenness formed outside the active region where metal is present from corrugating into the active region.

Figure 7:
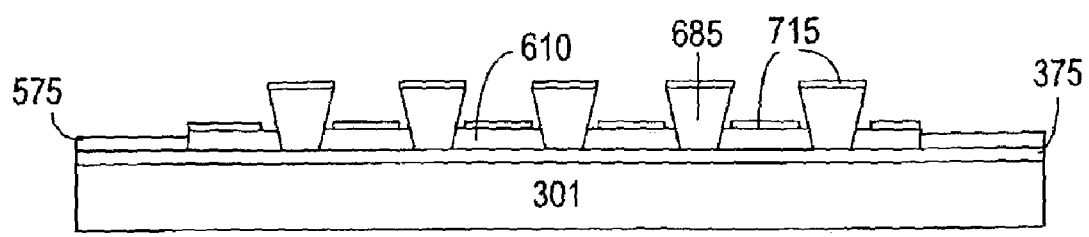

Referring to FIG. 7, a second conductive layer 715 is deposited on the substrate. The conductive layer comprises, for example, Ca, Mg, Ba, Ag, Al or a mixture or alloy thereof. Other conductive materials, particularly those comprising a low work function, can also be used to form the second conductive layer. Alternatively, the second conductive layer comprises an ionic compound, such as LiF, MgF, or CsF. In one embodiment, the second conductive layer comprises Ca. The Ca layer is deposited by, for example, thermal evaporation at a rate of 1 nm/s and a pressure of about $10^{-5}$ mbar. Alternatively, the second conductive layer comprises a composite layer or stack of multiple conductive layers. For example, the stack comprises a first layer of Ca followed by a second conductive layer of Ag or Al. Various deposition techniques, such as, thermal evaporation, sputtering (PVD), chemical vapor deposition (CVD), plasma enhanced chemical vapor deposition (PECVD) or metal organic chemical vapor deposition (MOCVD), can be used to form the second conductive layer. Preferably, a shadow mask is used to deposit the second conductive layer in the active area 585 of the device. The deposition of the second conductive layer is interrupted by the pillars, creating second electrodes or cathodes. The intersections of the cathodes and anodes form OLED cells.

The portions of the organic layer outside the active region are removed, as shown in FIG. 7. Etching can be done by, for example, laser ablation. In one embodiment, the organic material is removed prior to the formation of second electrodes. Patterning the organic layer after formation of the second electrodes can also be useful. To ensure that the organic material is completely removed, an overetch is performed. The overetch also partially removes the homogenous layer which also serves as the surface protection layer. However, no damage occurs in the metal interconnects from the laser ablation since they are protected by the surface protection layer.

Figure 8:
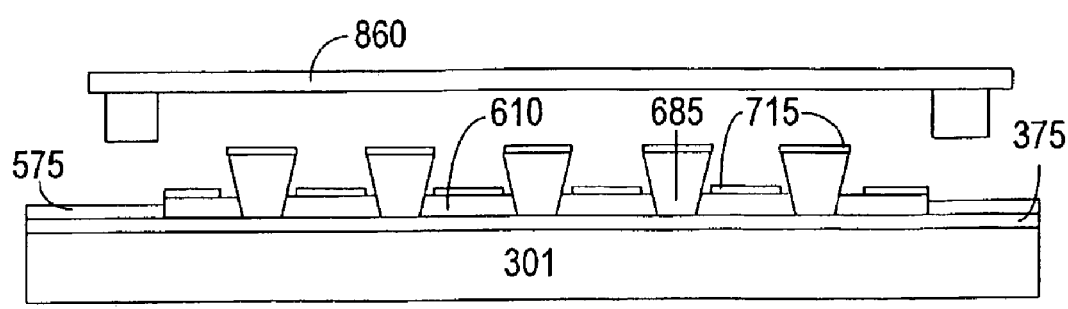

As shown in FIG. 8, the OLED device is completed by mounting a cap 860 to the cap bonding region of the substrate. After the OLED device is encapsulated, part of the homogenous layer outside the active area can be removed to expose the interconnects to the electrodes using, for example, conventional mask and wet or dry etch techniques. Other techniques, for example, laser ablation can also be used to remove the homogenous layer. This can be done at an energy density of, for example, 0.3 J/cm² and wavelength of 248 nm.

In a preferred embodiment, the homogenous layer is formed as part of the existing process for fabricating the OLED device. For example, a portion of the homogenous layer can remain on the substrate after formation of bond pads and interconnects to serve as the surface protection layer.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

The invention claimed is:

1. A device comprising:
   a substrate with an active region comprising at least one active component, wherein the active component includes an organic material;
   a cap bonding region surrounding the active region;
   conductive interconnects having first and second opposing major surfaces formed on the substrate, the first major surfaces in contact with the substrate, wherein at least portions of the conductive interconnects are located outside the active region on the substrate;
   an insulating homogenous layer located on the substrate above the conductive interconnects outside the active region and not in the active region;
   a subsequently deposited layer including the organic material, the subsequently deposited layer located at least in the active region wherein the homogenous layer has a side surface that is substantially perpendicular to the first and second opposing major surfaces of the conductive interconnects, the side surface contacting the subsequently deposited layer and reducing topography created by the second major surfaces of the conductive interconnects to promote uniform deposition of the subsequently deposited layer on the substrate at least inside the active region; and
   a cap bonded to the substrate in the cap bonding region.

2. The device of claim 1 comprises an OLED device.

3. The device of claim 1 comprises a flexible OLED device.

4. The device of claim 1 wherein the homogenous layer comprises a photosensitive material.

5. The device of claim 4 wherein the photosensitive material comprises photoresist or polyimide.

6. The device of claim 4 wherein:
   an adhesive is used to bond the cap to the substrate; and
   the cap, the homogenous layer and the adhesive form a sealing system to encapsulate the at least one active component.

7. The device of claim 4 wherein the homogenous layer also serves as a surface protection layer which protects a device layer or device layers below from damage when material from above the homogenous layer is removed.

8. The device of claim 7 wherein:
   an adhesive is used to bond the cap to the substrate; and
   the cap, the homogenous layer and the adhesive form a sealing system to encapsulate the at least one active component.

9. The device of claim 8 wherein the homogenous layer allows removal of material from the subsequently deposited layer without damaging a device layer or layers below the homogenous layer.

10. The device of claim 9 wherein an adhesive is used to bond the cap to the substrate.

11. The device of claim 10 wherein the cap, the homogenous layer and the adhesive form a sealing system.

12. The device of claim 11 wherein materials of the sealing system are selected to provide desired sealing characteristics.

13. The device of claim 4 wherein:
an adhesive is used to bond the cap to the substrate; and
the cap, the homogenous layer and the adhesive form a sealing system to encapsulate the at least one active component.

14. The device of claim 4 wherein the homogenous layer also serves as a surface protection layer which protects a device layer or device layers below from damage when material from above the homogenous layer is removed.

15. The device of claim 14 wherein:
an adhesive is used to bond the cap to the substrate; and
the cap, the homogenous layer and the adhesive form a sealing system to encapsulate the at least one active component.

16. The device of claim 14 wherein:
an adhesive is used to bond the cap to the substrate; and
the cap, the homogenous layer and the adhesive form a sealing system to encapsulate the at least one active component.

17. The device of claim 6 wherein the homogenous layer also serves as a surface protection layer which protects a device layer or device layers below from damage when material from above the homogenous layer is removed.

18. The device of claim 17 wherein:
an adhesive is used to bond the cap to the substrate; and
the cap, the homogenous layer and the adhesive form a sealing system to encapsulate the at least one active component.

19. The device of claim 1, wherein the conductive interconnects include a metal.

20. The device of claim 1, wherein the homogenous layer includes Novolak resin.

21. The device of claim 1, wherein the subsequently deposited layer includes a polymer.

22. The device of claim 9, wherein the homogenous layer allows removal of material by laser ablation of a layer disposed above the homogeneous layer without damaging device layer or layers below the homogenous layer.

23. The device of claim 11, wherein a portion of the homogenous layer is removed partially during the removal of material disposed above the homogeneous layer.

24. An OLED device comprising:
a substrate wit an active region, the active region comprising at least one OLED cell having at least one organic layer between top and bottom electrodes;
a cap bonding region surrounding the active region;
conductive interconnects having first and second opposing major surfaces formed on the substrate, the first major surfaces in contact with the substrate, wherein at least portions of the conductive interconnects are located outside the active region on the substrate, the conductive interconnects coupled to the at least one OLED cell;
an insulating homogenous layer located on the substrate above the conductive interconnects outside the active region and not in the active region;
at least one organic layer located at least in the active region, wherein the homogenous layer has a side surface substantially perpendicular to the first and second opposing major surfaces of the conductive interconnects, the side surface contacting the organic layer, the homogenous layer reducing topography created by the second major surfaces of the conductive interconnects to promote uniform deposition of the at least one organic layer on the substrate at least inside the active region; and
a cap bonded to the cap bonding region to encapsulate the OLED device.

25. The OLED device of claim 24 comprises a flexible OLED device.

26. The OLED device of claim 24 wherein the homogenous layer comprises either a photosensitive or non-photosensitive material.

27. The OLED device of claim 26 wherein:
an adhesive is used to bond the cap to the substrate; and
the cap, the homogenous layer and the adhesive form a sealing system to encapsulate the at least one OLED cell.

28. The OLED device of claim 26 wherein the homogenous layer also serves as a surface protection layer which protects a device layer or device layers below from damage when organic material from the at least one organic layer above the homogenous layer is removed.

29. The OLED device of claim 28 wherein:
an adhesive is used to bond the cap to the substrate; and
the cap, the homogenous layer and the adhesive form a sealing system to encapsulate the at least one OLED cell.

30. The device of claim 24, wherein the conductive interconnects include a metal.

31. The device of claim 24, wherein the subsequently deposited layer includes a polymer.

32. The device of claim 24, wherein the homogenous layer includes Novolak resin.

33. The device of claim 28, wherein the homogenous layer allows removal of material from above the homogeneous layer without damaging device layer or layers below the homogenous layer.

34. The device of claim 28, wherein a portion of the homogenous layer is removed partially during the removal of material from above the homogeneous layer.

35. A device comprising:
a substrate wit an active region, the active region comprising at least one active component configured to emit light;
conductive interconnects having first and second opposing major surfaces formed on the substrate, the first major surfaces in contact with the substrate, wherein at least portions of the conductive interconnects are located outside the active region on the substrate, the conductive interconnects coupled to the at least one active component;
an insulating homogenous layer located on the substrate above the conductive interconnects outside the active region, but not in the active region; and
a subsequently deposited layer capable of emitting light located at least in the active region, wherein the homogenous layer has a side surface substantially perpendicular to the first and second opposing major surfaces of the conductive interconnects, the side surface contacting the subsequently deposited layer, the homogenous layer reducing topography created by the second major surfaces of the conductive interconnects to promote uniform deposition of the subsequently deposited layer on the substrate.

36. The device of claim 35 further comprises:
a cap bonding region surrounding the active region; and
a cap bonded to the cap bonding region to encapsulate the device.

37. The device of claim 35 comprises an OLED device.

38. The device of claim 37 further comprises:
a cap bonding region surrounding the active region; and
a cap bonded to the cap bonding region of the substrate to encapsulate the device.

39. The device of claim 35 wherein the homogenous layer comprises either a photosensitive or non-photosensitive material.

40. The device of claim 39 wherein:
an adhesive is used to bond the cap to the substrate; and
the cap, the homogenous layer and the adhesive form a sealing system to encapsulate the at least one active component.

41. The device of claim 39 wherein the homogenous layer also serves as a surface protection layer which protects a device layer or device layers below from damage when material from above the homogenous layer is removed.

42. The device of claim 41 wherein:
an adhesive is used to bond the cap to the substrate; and
the cap, the homogenous layer and the adhesive form a sealing system to encapsulate the at least one active component.

43. The device of claim 41, wherein the homogenous layer allows removal of material by laser ablation above the homogeneous layer without damaging a device layer or layers below the homogenous layer.

44. The device of claim 41, wherein a portion of the homogenous layer is removed partially during the removal of material disposed above the homogeneous layer.

45. The device of claim 35, wherein the conductive interconnects include a metal.

46. The device of claim 35, wherein the homogenous layer includes Novolak resin.

47. The device of claim 35, wherein the subsequently deposited layer includes a polymer.

* * * * *

UNITED STATES PATENT AND TRADEMARK OFFICE
CERTIFICATE OF CORRECTION

PATENT NO.       : 7,148,624 B2
APPLICATION NO.  : 10/249533
DATED            : December 12, 2006
INVENTOR(S)      : Ewald Karl Michael Guenther et al.

It is certified that error appears in the above-identified patent and that said Letters Patent is hereby corrected as shown below:

Column 6, Lines 45 through 49 at Claim 6; replace:
"The device of claim 4 wherein: an adhesive is used to bond the cap to the substrate; and the cap, the homogenous layer and the adhesive form a sealing system to encapsulate the at least one active component." with
-- The device of claim 1 wherein the homogenous layer comprises a non-photosensitive material. --

Column 6, Lines 50 through 54 at Claim 7; replace:
"The device of claim 4 wherein the homogenous layer also serves as a surface protection layer which protects a device layer or device layers below from damage when material from above the homogenous layer is removed." with
-- The device of claim 6 wherein the non-photosensitive material comprises polyimide. --

Column 6, Lines 55 through 59 at Claim 8; replace:
"The device of claim 7 wherein: an adhesive is used to bond the cap to the substrate; and the cap, the homogenous layer and the adhesive form a sealing system to encapsulate the at least one active component." with
-- The device of claim 1 wherein the homogenous layer is also used as a surface protection layer. --

Column 7, Line 19 at Claim 16; replace:
"The device of claim 14 wherein:" with
-- The device of claim 6 wherein --

Column 7, Line 48 at Claim 24; replace:
"a substrate wit an active region, the active region com-" with
-- a substrate with an active region, the active region com- --

UNITED STATES PATENT AND TRADEMARK OFFICE
CERTIFICATE OF CORRECTION

PATENT NO. : 7,148,624 B2
APPLICATION NO. : 10/249533
DATED : December 12, 2006
INVENTOR(S) : Ewald Karl Michael Guenther et al.

It is certified that error appears in the above-identified patent and that said Letters Patent is hereby corrected as shown below:

Column 8, Line 44 at Claim 35; replace:
 "a substrate wit an active region, the active region com-"
 -- a substrate with an active region, the active region com- --

Signed and Sealed this

Twenty Second Day of April, 2008

JON W. DUDAS
*Director of the United States Patent and Trademark Office*